US008515214B1

United States Patent
Liao et al.

(10) Patent No.: US 8,515,214 B1
(45) Date of Patent: Aug. 20, 2013

(54) OPTICAL COMPONENT HAVING REDUCED DEPENDENCY ON ETCH DEPTH

(75) Inventors: Shirong Liao, Mira Loma, CA (US); Dazeng Feng, El Monte, CA (US)

(73) Assignee: Kotura, Inc., Monterey Park, CA (US)

( * ) Notice: Subject to any disclaimer, the term of this patent is extended or adjusted under 35 U.S.C. 154(b) by 0 days.

(21) Appl. No.: 13/385,372

(22) Filed: Feb. 15, 2012

Related U.S. Application Data

(63) Continuation of application No. 13/385,099, filed on Feb. 1, 2012.

(51) Int. Cl.
*G02F 1/035* (2006.01)
(52) U.S. Cl.
USPC .............................................. 385/2; 385/132
(58) Field of Classification Search
USPC ................... 385/2, 39, 40, 129–132; 372/26
See application file for complete search history.

(56) References Cited

U.S. PATENT DOCUMENTS

| | | | |
|---|---|---|---|
| 2007/0223543 A1* | 9/2007 | Prosyk et al. | 372/26 |
| 2008/0212913 A1* | 9/2008 | Gill et al. | 385/2 |

\* cited by examiner

*Primary Examiner* — Ellen Kim
(74) *Attorney, Agent, or Firm* — Gavrilovich, Dodd & Lindsey, LLP

(57) ABSTRACT

An optical device includes an active component on a base. The active component is a light sensor and/or a light modulator. The active component is configured to guide a light signal through a ridge of an active medium extending upwards from slab regions of the active medium. The slab regions are on opposing sides of the ridge. The active medium includes a doped region that extends into a lateral side of the ridge and also into one of the slab regions. The depth that the doped region extends into the slab region is further than the depth that the doped region extends into the ridge.

20 Claims, 8 Drawing Sheets

OPTICAL COMPONENT HAVING REDUCED DEPENDENCY ON ETCH DEPTH

RELATED APPLICATIONS

This application is a Continuation of U.S. patent application Ser. No. 13/385,099, filed Feb. 1, 2012, entitled "Optical Component Having Reduced Dependency on Etch Depth," and incorporated herein in its entirety.

FIELD

The present invention relates to optical devices and more particularly to devices having optical modulators and/or light sensors.

BACKGROUND

A variety of optical devices include an active component such as a light sensor or modulator. These active components typically guide a light signal through a component waveguide while an electrical field is applied to the component waveguide. The component waveguide can be partially defined by a ridge that extends upwards from slab regions. The performance of these components is often very sensitive to the thickness of these slab regions. Since these slab regions are generally formed by etching, the thickness of the slab regions is difficult to control. As a result, the performance of different active devices is often inconsistent. The inconsistency of these optical devices can provide an undesirably large level of waste in the fabrication process.

For the above reasons, there is a need for optical devices having consistent performance.

SUMMARY

An optical device includes an active component on a base. The active component is a light sensor and/or a light modulator. The active component is configured to guide a light signal through a ridge of an active medium extending upwards from slab regions of the active medium. The slab regions are on opposing sides of the ridge. The active medium includes a doped region that extends into a lateral side of the ridge and also into one of the slab regions. The depth that the doped region extends into the slab region is further than the depth that the doped region extends into the ridge.

Another embodiment of the optical device includes an active component on a base. The active component is a light sensor and/or a light modulator. The active component guides light signals through a ridge of an active medium that is positioned on a light-transmitting medium such that the light-transmitting medium is between the active medium and the base. The ridge extends upwards from slab regions located on opposing sides of the ridge. A doped region extends into a lateral side of the ridge of the active medium and also extends into one of the slab regions such that at least a portion of the doped region extends into a light-transmitting medium that is located between the active medium and the base. A method of forming the active component includes forming the doped regions of the active component. Forming each of the doped regions includes forming a first doped zone and a second doped zone that combine to form the doped region.

BRIEF DESCRIPTION OF THE FIGURES

FIG. 1A is a perspective view of the device.

FIG. 1B is a topview of the portion of the optical device shown in FIG. 1A that includes an optical modulator.

FIG. 1C is a cross-section of the device shown in FIG. 1A taken along the line labeled C.

FIG. 1D is a cross-section of the optical device shown in FIG. 1A taken along the line labeled D.

FIG. 1E is a cross-section of the optical device shown in FIG. 1A taken along the line labeled E.

FIG. 1F is a cross-section of the optical device shown in FIG. 1A taken along the line labeled F.

FIG. 1G is a cross-section of the optical device shown in FIG. 1A taken along the line labeled G.

DESCRIPTION

An optical device that includes an active component that serves as a light modulator and/or a light sensor is disclosed. The active component includes a ridge of an active medium extending from slab regions positioned on opposing sides of the active medium. Doped regions each extends into both the slab region and the ridge. During operation, an electrical energy is applied to these doped regions so as to form an electrical field between the doped regions.

The active component has a reduced sensitivity to slab region thickness because at least two doped zones combine to form each of the doped regions. The doped zones that make up each doped region are formed at different times during the fabrication process. In one examples of the fabrication process, the slab regions are intentionally over-etched in order to reduce the effects of an undesirably thick slab region. The placement and processing of the doped zones addresses the reduction in speed that normally accompanies this over-etching. As a result, the sensitivity of the active component to the thickness of the slab regions is reduced. In another example of the fabrication process, the slab regions are intentionally under-etched in order to reduce the effects of an undesirably thin slab region. The placement and processing of the doped zones addresses the reduction in speed that normally accompanies this under-etching. As a result, the sensitivity of the active component to the thickness of the slab regions is reduced.

Figure 1A:
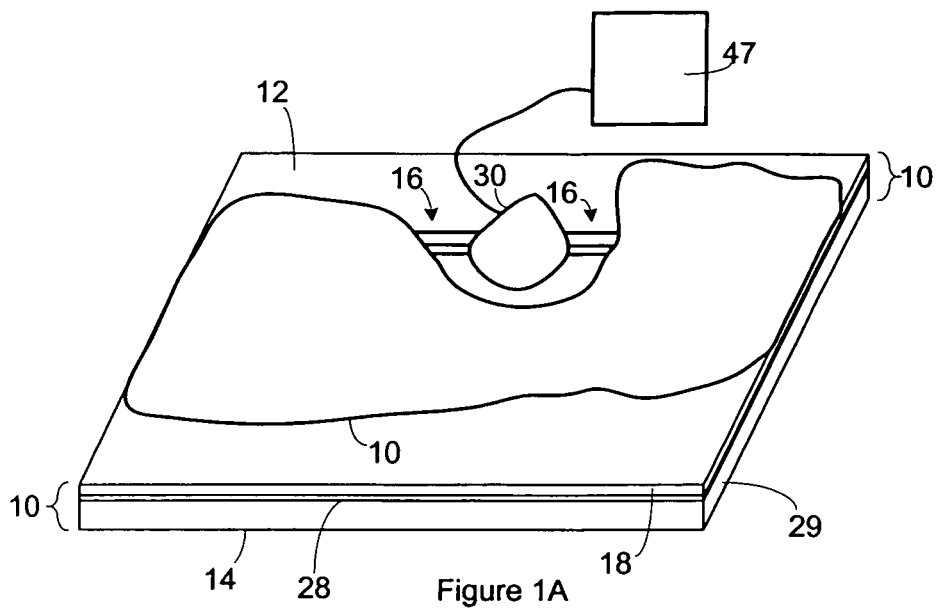
FIG. 1A through FIG. 1G illustrate an optical device having an active component configured to operate as a modulator and/or a light sensor.
Figure 1B:
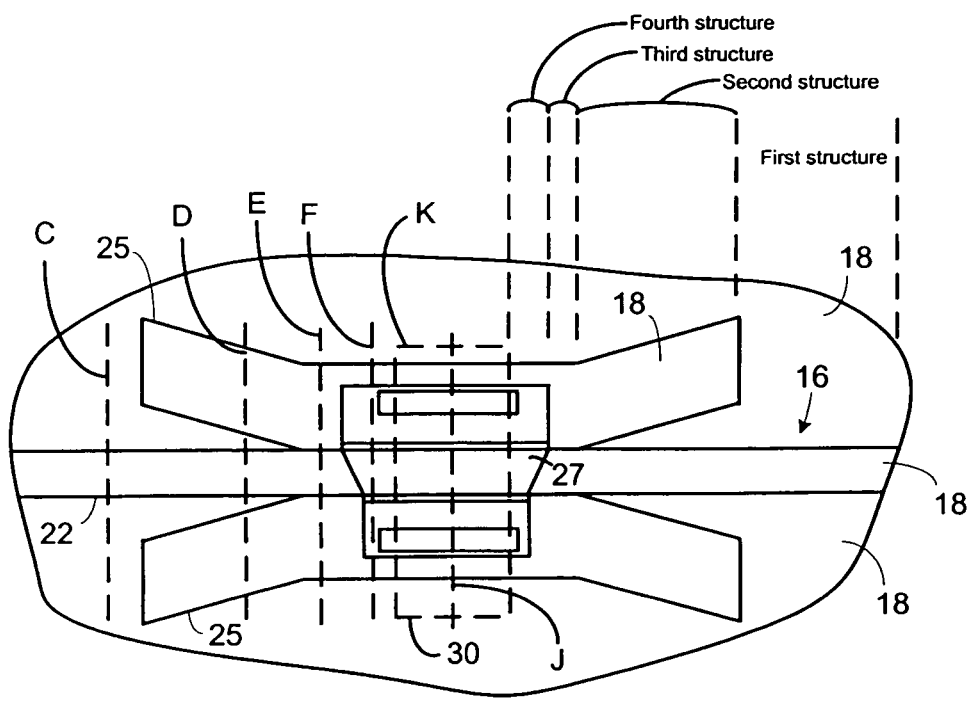
Figures 1C, 1D:
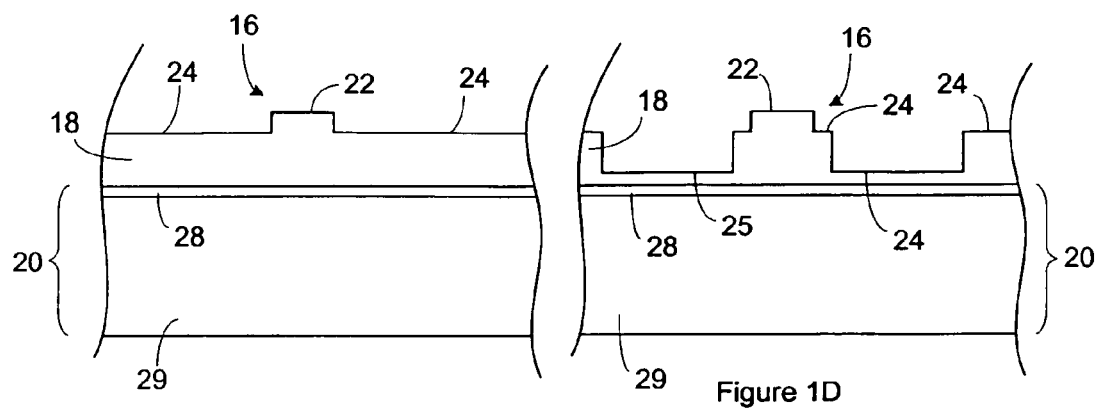
Figures 1E, 1F:
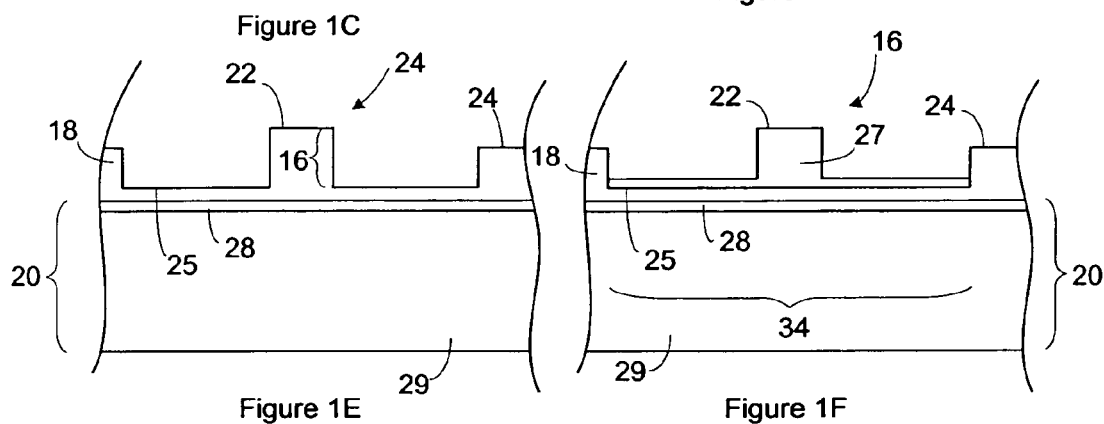
Figure 1G:
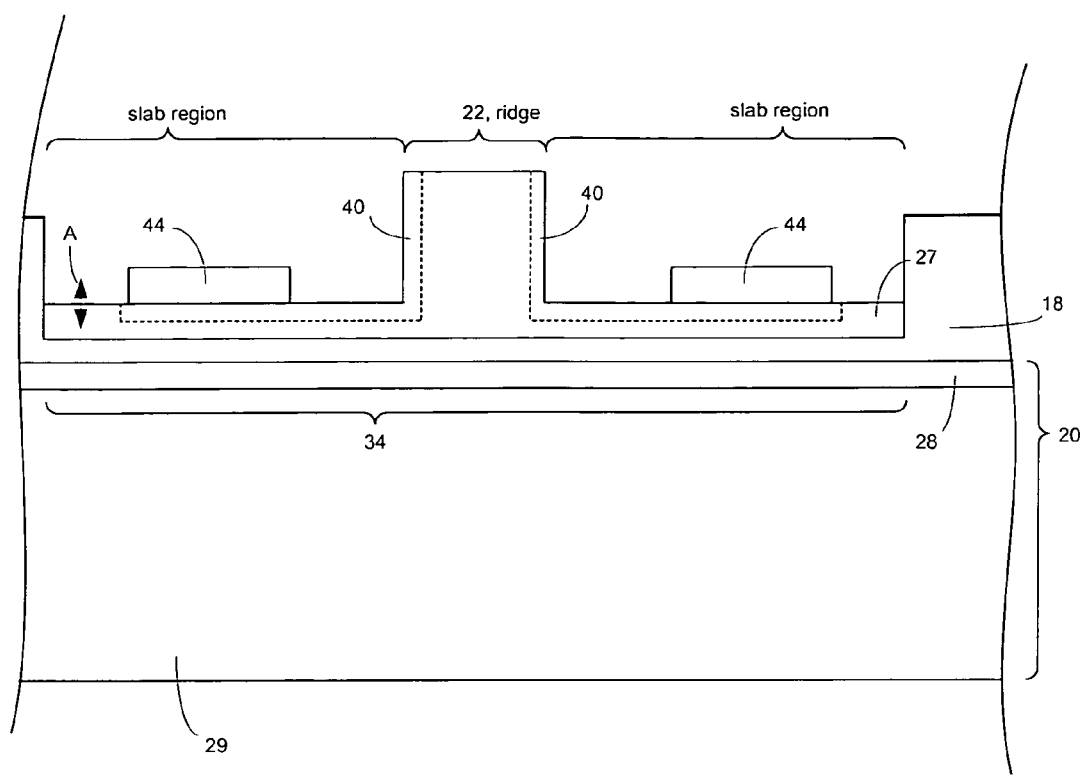

FIG. 1A through FIG. 1G illustrate an optical device having a waveguide that includes a modulator. FIG. 1A is a perspective view of the device. FIG. 1B is a topview of the portion of the optical device shown in FIG. 1A that includes an optical modulator. FIG. 1C is a cross-section of the device shown in FIG. 1A taken along the line labeled C. FIG. 1D is a cross-section of the optical device shown in FIG. 1A taken along the line labeled D. FIG. 1E is a cross-section of the optical device shown in FIG. 1A taken along the line labeled E. FIG. 1F is a cross-section of the optical device shown in FIG. 1A taken along the line labeled F. FIG. 1G is a cross-section of the optical device shown in FIG. 1A taken along the line labeled G.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the top side of the base, the bottom side of the base, the top side of the substrate, and/or the bottom side of the substrate.

The illustrated device includes lateral sides 10 (or edges) extending from a top side 12 to a bottom side 14. The propagation direction of light signals along the length of the waveguides on a planar optical device generally extends through the lateral sides 10 of the device. The top side 12 and the bottom side 14 of the device are non-lateral sides.

The device includes one or more waveguides 16 that carry light signals to and/or from optical components 17. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, amplifiers for amplifying the intensity of a light signal, attenuators for attenuating the intensity of a light signal, modulators for modulating a signal onto a light signal, modulators that convert an light signal to an electrical signal, and vias that provide an optical pathway for a light signal traveling through the device from the bottom side 14 of the device to the top side 12 of the device. Additionally, the device can optionally, include electrical components. For instance, the device can include electrical connections for applying a potential or current to a waveguide and/or for controlling other components on the optical device.

A portion of the waveguide includes a first structure where a portion of the waveguide 16 is defined in a light-transmitting medium 18 positioned on a base 20. For instance, a portion of the waveguide 16 is partially defined by a ridge 22 extending upward from a slab region of the light-transmitting medium as shown in FIG. 1C. In some instances, the top of the slab region is defined by the bottom of trenches 24 extending partially into the light-transmitting medium 18 or through the light-transmitting medium 18. Suitable light-transmitting media include, but are not limited to, silicon, polymers, silica, SiN, GaAs, InP and LiNbO$_3$. One or more cladding layers (not shown) are optionally positioned on the light-transmitting medium. The one or more cladding layers can serve as a cladding for the waveguide 16 and/or for the device. When the light-transmitting medium 18 is silicon, suitable cladding layers include, but are not limited to, silicon, polymers, silica, SiN, GaAs, InP and LiNbO$_3$.

Recesses 25 (FIG. 1B) extend into the slab regions such that the ridge 22 is positioned between recesses 25. The recesses 25 can extend only part way into the light-transmitting medium 18. As is evident from FIG. 1D, the recesses 25 can be spaced apart from the ridge 22. As a result, a portion of the waveguide 16 includes a second structure where an upper portion of the waveguide 16 is partially defined by the ridge 22 extending upward from the slab region and a lower portion of the waveguide is partially defined by recesses 25 extending into the slab regions and spaced apart from the ridge.

As shown in FIG. 1E, the recesses 25 can approach the ridge 22 such that the sides of the ridge 22 and the sides of the recesses 25 combine into a single surface 26. As a result, a portion of a waveguide includes a third structure where the waveguide is partially defined by the surface 26.

As is evident in FIG. 1B, a portion of the waveguide includes an active medium 27 such as an electro-absorption medium. The active medium 27 is configured to receive the light signals from a portion of the waveguide having the third structure and to guide the received light signals to another portion of the waveguide having the third structure.

In FIG. 1F, a ridge 22 of active medium 27 extends upward from a slab region of the active medium 27. Accordingly, a portion of a waveguide includes a fourth structure where the waveguide is partially defined by the top and lateral sides of the active medium 27. The slab regions of the active medium 27 and the ridge 22 of the active medium 27 are both positioned on a seed portion 34 of the light-transmitting medium 18. As a result, the seed portion 34 of the light-transmitting medium 18 is between the active medium 27 and the base 20. In some instances, when the light signal travels from the light-transmitting medium into the active medium 27, a portion of the light signal enters the seed portion 34 of the light-transmitting medium 18 and another portion of the light signal enters the active medium 27. As described above, the active medium 27 can be grown on the seed portion of the light-transmitting medium 18.

As is evident in FIG. 1B, there is an interface between each facet of the active medium 27 and a facet of the light-transmitting medium 18. The interface can have an angle that is non-perpendicular relative to the direction of propagation of light signals through the waveguide 16 at the interface. In some instances, the interface is substantially perpendicular relative to the base 20 while being non-perpendicular relative to the direction of propagation. The non-perpendicularity of the interface reduces the effects of back reflection. Suitable angles for the interface relative to the direction of propagation include but are not limited to, angles between 80° and 89°, and angles between 80° and 85°.

The portion of the base 20 adjacent to the light-transmitting medium 18 is configured to reflect light signals from the waveguide 16 back into the waveguide 16 in order to constrain light signals in the waveguide 16. For instance, the portion of the base 20 adjacent to the light-transmitting medium 18 can be an optical insulator 28 with a lower index of refraction than the light-transmitting medium 18. The drop in the index of refraction can cause reflection of a light signal from the light-transmitting medium 18 back into the light-transmitting medium 18. The base 20 can include the optical insulator 28 positioned on a substrate 29. As will become evident below, the substrate 29 can be configured to transmit light signals. For instance, the substrate 29 can be constructed of a light-transmitting medium 18 that is different from the light-transmitting medium 18 or the same as the light-transmitting medium 18. In one example, the device is constructed on a silicon-on-insulator wafer. A silicon-on-insulator wafer includes a silicon layer that serves as the light-transmitting medium 18. The silicon-on-insulator wafer also includes a layer of silica positioned on a silicon substrate. The layer of silica can serving as the optical insulator 28 and the silicon substrate can serve as the substrate 29.

The optical device includes an active component 30 such as a modulator and/or light sensor. The location of the modulator on the optical device is illustrated by the line labeled K in FIG. 1B. In order to simplify FIG. 1B, the details of the modulator construction are not shown in FIG. 1B. However, the modulator construction is evident from other illustrations such as FIG. 1G. The modulator of FIG. 1G is constructed on the portion of the waveguide having a fourth structure constructed according to FIG. 1F. The perimeter of portions of doped regions shown in FIG. 1G are illustrated with dashed lines to prevent them from being confused with interfaces between different materials. The interfaces between different materials are illustrated with solid lines. The modulator is configured to apply an electric field to the active medium 27 in order to phase and/or intensity modulate the light signals received by the modulator.

A ridge 22 of the active medium 27 extends upward from a slab region of the active medium 27. Doped regions 40 are both in the slab regions of the active medium 27 and also in the ridge of the active medium 27. For instance, doped regions 40 of the active medium 27 are positioned on the lateral sides of the ridge 22 of the active medium 27. In some instances, each of the doped regions 40 extends up to the top side of the active medium 27 as shown in FIG. 1G. Additionally, the doped regions 40 extend away from the ridge 22 into the slab region of the active medium 27. The transition of a doped region 40 from the ridge 22 of the active medium 27 into the slab region of the active medium 27 can be continuous and unbroken as shown in FIG. 1G.

Each of the doped regions 40 can be an N-type doped region or a P-type doped region. For instance, each of the N-type doped regions can include an N-type dopant and each of the P-type doped regions can include a P-type dopant. In some instances, the active medium 27 includes a doped region 40 that is an N-type doped region and a doped region 40 that is a P-type doped region. The separation between the doped regions 40 in the active medium 27 results in the formation of PIN (p-type region-insulator-n-type region) junction in the modulator 30.

In the active medium 27, suitable dopants for N-type regions include, but are not limited to, phosphorus and/or arsenic. Suitable dopants for P-type regions include, but are not limited to, boron. The doped regions 40 are doped so as to be electrically conducting. A suitable concentration for the P-type dopant in a P-type doped region includes, but is not limited to, concentrations greater than $1 \times 10^{15}$ cm$^{-3}$, $1 \times 10^{17}$ cm$^{-3}$, or $1 \times 10^{19}$ cm$^{-3}$, and/or less than $1 \times 10^{17}$ cm$^{-3}$, $1 \times 10^{19}$ cm$^{-3}$, or $1 \times 10^{21}$ cm$^{-3}$. A suitable concentration for the N-type dopant in an N-type doped region includes, but is not limited to, concentrations greater than $1 \times 10^{15}$ cm$^{-3}$, $1 \times 10^{17}$ cm$^{-3}$, or $1 \times 10^{19}$ cm$^{-3}$, and/or less than $1 \times 10^{17}$ cm$^{-3}$, $1 \times 10^{19}$ cm$^{-3}$, or $1 \times 10^{21}$ cm$^{-3}$.

Electrical conductors 44 are positioned on the slab region of the active medium 27. In particular, the electrical conductors 44 each contact a portion of a doped region 40 that is in the slab region of the active medium 27. Accordingly, the each of the doped regions 40 is doped at a concentration that allows it to provide electrical communication between an electrical conductor 44 and one of the doped regions 40 in the active medium 27. As a result, electrical energy can be applied to the electrical conductors 44 in order to apply the electric field to the active medium 27. The region of the light-transmitting medium or active medium between the doped regions can be undoped or lightly doped as long as the doping is insufficient for the doped material to act as an electrical conductor that electrically shorts the active component.

During operation of the modulators of FIG. 1A through FIG. 1G, electronics 47 (FIG. 1A) can be employed to apply electrical energy to the electrical conductors 44 so as to form an electrical field in the active medium 27. For instance, the electronics can form a voltage differential between the field sources. The electrical field can be formed without generating a significant electrical current through the active medium 27. The active medium 27 can be a medium in which the Franz-Keldysh effect occurs in response to the application of the electrical field. The Franz-Keldysh effect is a change in optical absorption and optical phase by an active medium 27. For instance, the Franz-Keldysh effect allows an electron in a valence band to be excited into a conduction band by absorbing a photon even though the energy of the photon is below the band gap. To utilize the Franz-Keldysh effect the active region can have a slightly larger bandgap energy than the photon energy of the light to be modulated. The application of the field lowers the absorption edge via the Franz-Keldysh effect and makes absorption possible. The hole and electron carrier wavefunctions overlap once the field is applied and thus generation of an electron-hole pair is made possible. As a result, the active medium 27 can absorb light signals received by the active medium 27 and increasing the electrical field increases the amount of light absorbed by the active medium 27. Accordingly, the electronics can tune the electrical field so as to tune the amount of light absorbed by the active medium 27. As a result, the electronics can intensity modulate the electrical field in order to modulate the light signal. Additionally, the electrical field needed to take advantage of the Franz-Keldysh effect generally does not involve generation of free carriers by the electric field.

Suitable active media 27 for use in the modulator include electro-absorption media 27 such as semiconductors. However, the light absorption characteristics of different semiconductors are different. A suitable semiconductor for use with modulators employed in communications applications includes $Ge_{1-x}Si_x$ (germanium-silicon) where x is greater than or equal to zero. In some instances, x is less than 0.05, or 0.01. Changing the variable x can shift the range of wavelengths at which modulation is most efficient. For instance, when x is zero, the modulator is suitable for a range of 1610-1640 nm. Increasing the value of x can shift the range of wavelengths to lower values. For instance, an x of about 0.005 to 0.01 is suitable for modulating in the c-band (1530-1565 nm).

The structure illustrated in FIG. 1G can also be employed as a light sensor. For instance, the active medium 27 can be a light-absorbing medium such as germanium. Accordingly, the number 27 in FIG. 1A through FIG. 1G can represent a light-absorbing medium. During operation of the light sensor, a reverse bias electrical field is applied across the active medium 27. When the active medium 27 absorbs a light signal, an electrical current flows through the active medium 27. As a result, an electrical current through the light-absorbing medium indicates receipt of a light signal. Additionally, the magnitude of the current can indicate the power and/or intensity of the light signal. Different active media 27 can absorb different wavelengths and are accordingly suitable for use in a light sensor depending on the function of the light sensor. A light-absorbing medium that is suitable for detection of light signals used in communications applications includes, but are not limited to, germanium, silicon germanium, silicon germanium quantum well, GaAs, and InP. Germanium is suitable for detection of light signals having wavelengths in a range of 1300 nm to 1600 nm. In some instance, the electronics can be configured to operate a structure as shown in FIG. 1G as both a modulator and a light detector.

Modulators and/or light sensors having a cross section according to 1G can be used in configurations other than the configuration of FIGS. 1A through 1F. Additional details about the fabrication, structure and operation of a modulator having a cross section according to FIG. 1G can be found in U.S. patent application Ser. No. 12/653,547, filed on Dec. 15, 2009, entitled "Optical Device Having Modulator Employing Horizontal Electrical Field," and incorporated herein in its entirety. Additional details about the fabrication, structure and operation of a light sensor having a cross section according to FIG. 1G can be found in U.S. Patent Application No. 61/572,841, filed on Jul. 21, 2011, entitled "Optical Device Having Light Sensor with Doped Regions;" and also in U.S. patent application Ser. No. 13/136,828, filed on Aug. 10, 2011, entitled "Application of Electrical Field Power to Light-Transmitting Medium," each of which is incorporated herein in its entirety, A light sensor and/or modulator having a cross section according to FIG. 1G is an example of an active component with a performance that is sensitive to the thickness of the slab regions of the active medium 27. For instance, as the thickness of the slab region increases, the ridge becomes smaller and the electrical field formed between the doped regions 40 accordingly fills a smaller portion of the distance between the base and the top of the ridge. For instance, the location of the electrical field effectively moves upwards from the base. The increased space between the electrical field and the base can be thought of as increasing the resistance or carrier diffusion time of the active component. This increase in resistance and/or diffusion time decreases the speed of the active component. Problems also occur when these slab regions become undesirably thin. When these slab regions become thin, the doped regions extend down into the light-transmitting medium 18. This doping of the light-transmitting medium 18 also decreases the speed of the active component.

Figure 2:
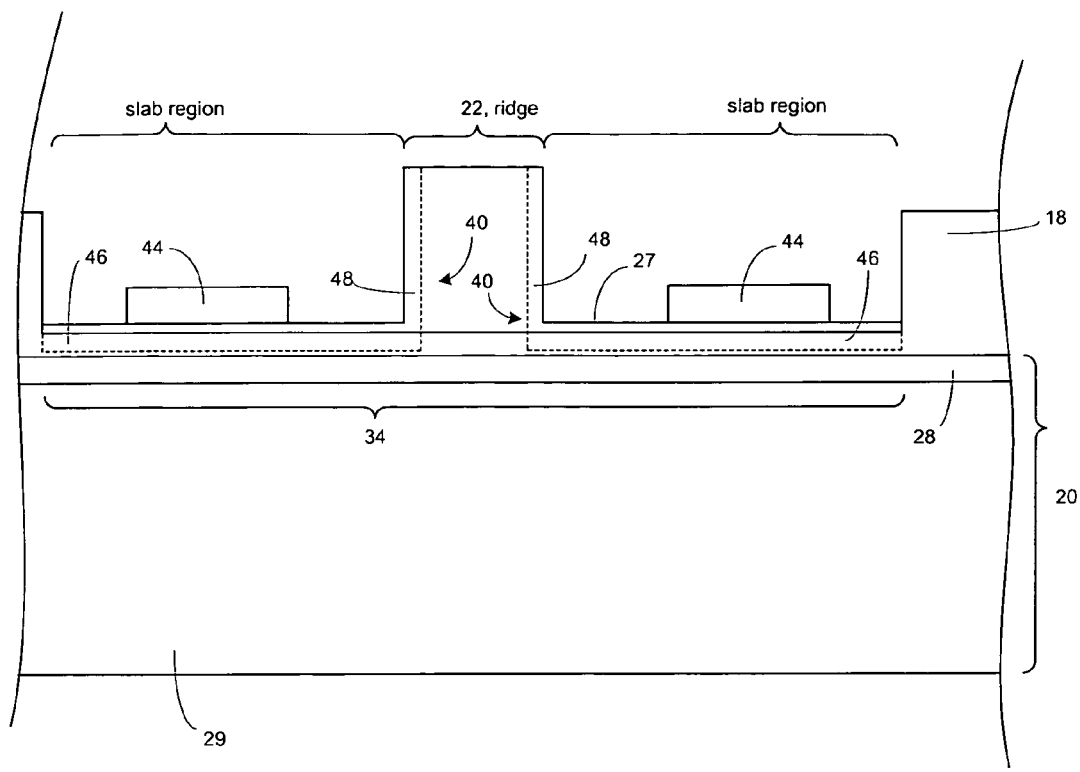
FIG. 2 is a cross section of an embodiment of an active component having a reduced sensitivity to the thickness of slab regions located on opposing sides of a ridge.

FIG. 2 presents an embodiment of an active component having a reduced sensitivity to the thickness of the slab regions. The perimeter of portions of doped regions shown in FIG. 2 are illustrated with dashed lines to prevent them from being confused with interfaces between different materials. The interfaces between different materials are illustrated with solid lines. A first doped zone 46 and a second doped zone 48 combine to form each of the doped regions 40. In some instance, the first doped zone 46 is located in the light-transmitting medium 18 but not in the active medium 27 and the second doped zone 48 is located in the active medium 27. The first doped zone 46 can contact the second doped zone 48 or can overlap with the second doped zone 48. In some instances, the first doped zone 46 and the second doped zone 48 overlap and at least a portion of the overlap is located in the light-transmitting medium 18. In other instances, the first doped zone 46 and the second doped zone 48 overlap without any overlap being present in the active medium 27.

The first doped zone 46 and the second doped zone 48 included in the same doped region 40 each includes the same type of dopant. For instance, the first doped zone 46 and the second doped zone 48 in an n-type doped region 40 each includes an n-type dopant. The first doped zone 46 and the second doped zone 48 included in the same doped region 40 can have the same dopant concentration or different concentrations.

Although FIG. 2 illustrates the slab regions of the active medium 27, the slab regions of the active medium 27 may not be present. For instance, the etch that forms the slab regions of the active medium 27 may etch all the way through the slab regions. In these instances, the first doped zone 46 and the second doped zone 48 are both formed in the light-transmitting medium.

Although FIG. 2 shows the first doped zone 46 not extending down to the optical insulator 28, the first doped zone 46 can extend down to the optical insulator 28 or into the optical insulator 28.

The optical device of FIG. 2 can be constructed using fabrication technologies that are employed in the fabrication of integrated circuits, optoelectronic circuits, and/or optical devices. FIG. 3A through FIG. 3E illustrate a method of forming the active component of FIG. 2. The method is illustrated using a silicon-on-insulator wafer or chip as the starting precursor for the optical device. However, the method can be adapted to platforms other than the silicon-on-insulator platform.

Figure 3A:
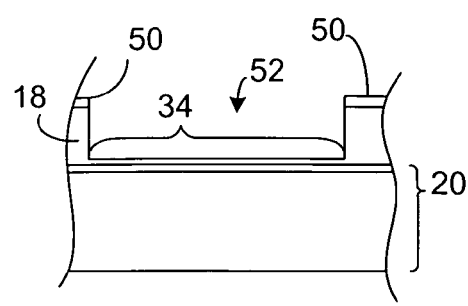
FIG. 3A through FIG. 3E illustrate a method of forming the active component of FIG. 2.

FIG. 3A illustrate a first mask 50 formed on a silicon-on-insulator wafer or chip to provide a device precursor. FIG. 3A is a cross-section of the device precursor. The first mask 50 leaves exposed a region of the device precursor where an active cavity 52 is to be formed while the remainder of the illustrated portion of the device precursor is protected. The active cavity 52 is the region of the device precursor where the active medium 27 will be formed. A first etch is then performed so as to form the active cavity 52. The first etch yields the device precursor of FIG. 3A. The first etch is performed such that the seed portion 34 of the light-transmitting medium 18 remains on the base 20. Accordingly, the first etch is terminated before the base 20 is reached.

A suitable first mask 50 includes, but is not limited to, a hard mask such as a silica mask. A suitable first etch includes, but is not limited to, a dry etch.

Figure 3B:
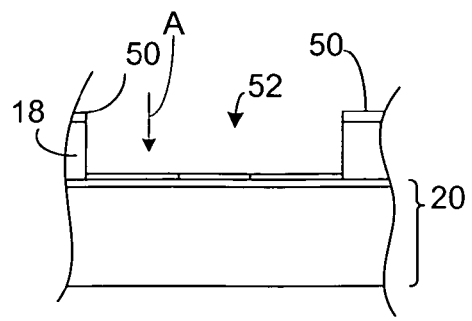

The n-type first doped zone 46 and the p-type first doped zone 46 are serially formed in the light-transmitting medium at the bottom of the active cavity 52 to provide the device precursor of FIG. 3B. Suitable methods of forming the first doped zones 46 include, but are not limited to, dopant implantation. The n-type first doped zone 46 can be masked during the formation of the p-type first doped zone and the p-type first doped zone 46 can be masked during the formation of the n-type first doped zone. As illustrated by the arrow labeled A in FIG. 3A, the direction of the dopant implantation during the formation of the first doped zones 46 can be substantially perpendicular to the surface of the light-transmitting medium at the bottom of the active cavity 52.

In some instances, the device precursor is annealed after the formation of the first doped zones 46. A suitable annealing temperature includes temperatures greater than 950° C., 1000° C., or 1050° C. and/or less than 1100° C., 1150° C., or 1200° C.

Figure 3C:
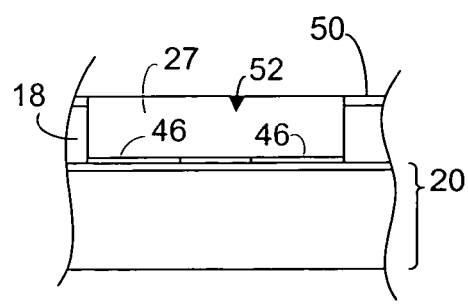

After annealing, the active medium 27 is formed in the active cavity 52 of FIG. 3B so as to provide the device precursor of FIG. 3C. When the light-transmitting medium 18 is silicon and the active medium 27 is germanium or germanium-silicon, the active absorption medium 27 can be grown on the seed portion 34 of the light-transmitting medium.

After formation of the active medium 27, the first mask 50 can be removed and the device precursor can be planarized. Suitable planarization methods include, but are not limited to, a chemical-mechanical polishing (CMP) process.

Figure 3D:
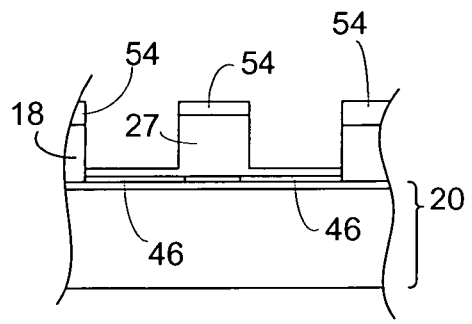

A second mask 54 can be formed on the device precursor as shown on the device precursor of FIG. 3D. The second mask 54 is formed such that the regions where the ridge of the active medium 27 is to be formed is protected while the remainder of the active medium 27 remains exposed. The portion of the second mask 54 that is protecting the region of the device precursor where the ridge is to be formed can extend over a portion of one or more of the first doped zones. For instance, FIG. 3D shows the second mask being located over a portion of each of the first doped zones. A suitable second mask 54 includes a hard mask such as a silica mask. A second etch is performed so as to form the ridge in the active medium as shown in the device precursor of FIG. 3D. Since the second mask 54 is shown as being located over a portion of each one of the first doped zones, the second mask forms the ridge such that a portion of each first doped zone is located under the ridge. In other instances, the portion of the second mask 54 that is protecting the region of the device precursor where the ridge is to be formed does not extend over any portion of the one or more first doped zones.

Although FIG. 3D shows the second etch leaving slab regions of the active medium 27 next to the ridge of active medium 27, the second etch can be performed until there is no active medium 27 next to the ridge of active medium. For instance, the second can etch through the active medium 27 to the light-transmitting medium 18. As a result, the underlying light-transmitting medium 18 can define the top of the slab region. In some instances, the second can etch into through the active medium 27 and into the light-transmitting medium 18. In this instance, the underlying light-transmitting medium 18 can define the top of the slab region. A suitable second etch includes, but is not limited to, a dry etch.

Figure 3E:
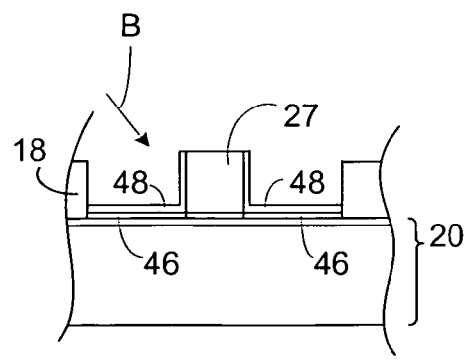

The n-type second doped zone 48 and the p-type second doped zone 48 are serially formed in the active medium 27 included in the ridge of the active medium and also in the adjacent slabs. When the second etch is performed such that there are slab regions of the active medium 27 adjacent to the ridge of active medium 27, the second doped zones are also formed in the slab regions of the active medium 27 as shown in FIG. 3E. When the second etch is performed such that slab regions of the active medium 27 are not present adjacent to the ridge of active medium 27, the second doped zones can also be formed in the underlying material. For instance, when the second etch is performed such that slab regions of the active medium 27 are not present adjacent to the ridge, the second doped zones can also be formed in the underlying light-transmitting medium 18. Since two different doped zones combine to form the portion of each doped region that is located in the slab region but essentially a single doped zone forms the portion of the region that is located in the ridge, each doped region can extend further into the slab region that it extends into the ridge.

Suitable methods of forming the second doped zones 48 include, but are not limited to, dopant implantation. Although not shown, the n-type second doped zone 48 can be masked during the formation of the p-type second doped zone 48 and the p-type second doped zone 48 can be masked during the formation of the n-type second doped zone 48. As illustrated by the arrow labeled B in FIG. 3E, the direction of the dopant implantation during the formation of the second doped zones 48 can be angled such that the doping for the second doped zone 48 occurs both in the ridge and in the material(s) located adjacent to the ridge and at the bottom of the active cavity 52. The electrical conductors 44 can be added to the device precursor of FIG. 3E to provide the active component of FIG. 2. A comparison of FIG. 3E with FIG. 2 shows that a first doped zone 46 and a second doped zone 48 from FIG. 3E combine to serves as each one of the doped regions of FIG. 2.

As is evident from the above method, the device can be annealed between forming the first doped zones 46 and forming the active medium 27 on the light-transmitting medium 18. Light-transmitting media 18 such as silicon can be annealed at higher temperature than active media 27 such as germanium or $Ge_{1-x}Si_x$. For instance, silicon can be annealed at around 1000° C. where $Ge_{1-x}Si_x$ can generally be annealed at around 600° C. Accordingly, annealing the device precursor before forming the active medium 27 allows the device precursor to be annealed at a higher temperature that would occur by annealing the device precursor after forming the active medium 27. Annealing at higher temperatures activates a larger portion of the dopant and accordingly results in a doped region with a lower resistance than would occur as a result of annealing at lower temperatures. As a result, the doped regions formed in the light-transmitting medium 18 can have a lower resistance than when doped regions are formed in the light-transmitting medium 18 after the active medium 27 is grown on the device.

Since the above method can reduce the resistance of the portion of a doped region 40 in the active medium, the slab regions of the active medium 27 can be very thin or even altogether removed without undesirably slowing the speed of the active component. Accordingly, the second etch can be an intentional over-etch relative to the active component of FIG. 1G. Successful application of an over-etch is assisted by the slower etch rate of Si compared to Ge. The duration of the second etch can be longer than the etch that is associated with generating slab regions of active medium 27 with the thickness of FIG. 1G. A benefit of intentionally over-etching during the second etch can also the elimination of undesirably thick active medium 27 slab regions. As a result, the method of FIG. 3A through FIG. 3E provides an active component that is not strongly dependent on the thickness of the slab regions. Without this dependence, the effects of inconsistent etching results do not affect the device fabrication and there is less waste in the fabrication process.

Figure 4:
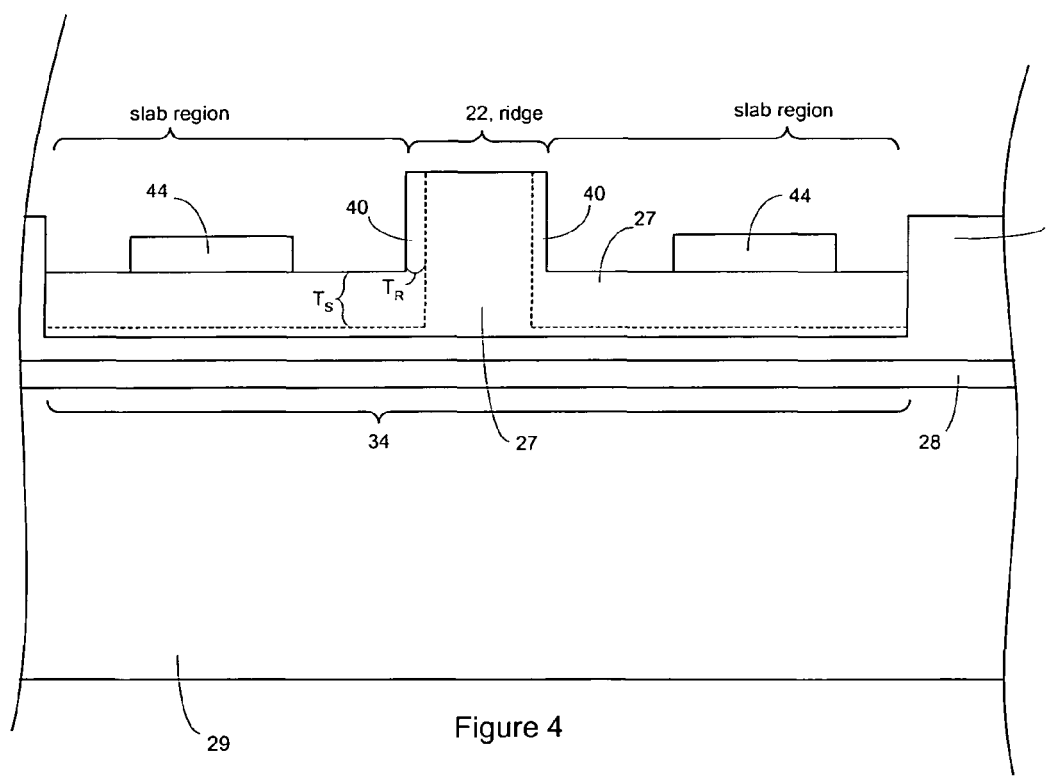
FIG. 4 is a cross section of an active component having a reduced sensitivity to the thickness of the slab regions.

FIG. 4 presents another embodiment of an active component having a reduced sensitivity to the thickness of the slab regions. The perimeter of portions of doped regions shown in FIG. 4 are illustrated with dashed lines to prevent them from being confused with interfaces between different materials. The interfaces between different materials are illustrated with solid lines.

The doped regions 40 each includes a portion that extends into the ridge of active medium 27 and another portion that extends into the slab region of the active medium 27. The doped region 40 extends further into the slab region of the active medium than the doped region extends into the ridge of the active medium. For instance, the portion of each doped region 40 in the slab region of the active medium 27 is thicker than the portion in the ridge. Reducing the extension of the doped region into the ridge reduces the interaction between the doped region and a light signal being guided through the ridge. As a result, a reduced extension of the doped region into the ridge reduces optical loss. Extending the doped region further into the slab regions allows the electrical field formed between the doped regions to move closer to the base. As a result, the extension of the doped regions further into the slab increases the portion of the light signal that interacts with the electrical field. Accordingly, problems associated with increasing the thickness of the slab regions do not arise because they can be addressed by extending the doped regions 40 further into the slab regions.

A suitable thickness for the portion of the doped region 40 in the ridge (labeled $T_R$ in FIG. 4) includes a thickness greater than 0.01, 0.075, 0.1, or 0.125 μm and/or less than 0.175, 0.2, or 0.5 μm. A suitable thickness for the portion of the doped region 40 in the slab region of the active medium 27 (labeled $T_s$ in FIG. 4) includes a thickness greater than 0.175, 0.2, or 0.225 μm and/or less than 0.275, 0.3, 0.325, or 0.8 μm. A suitable thickness ratio (ratio of thickness of portion of doped region in the slab region: thickness of portion of doped region in the ridge) includes ratios greater than 1, 1.25, or 1.5 and/or less than 2.0, 2.5, and 3.

The doped regions 40 can each be a result of combining a first doped zone (not shown in FIG. 4) and a second doped zone (not shown in FIG. 4). The first doped zone can be located in the slab region of the active medium and the second doped zone can be located both in the ridge and in the slab region of the active medium 27. The first doped zone and the second doped zone included in the same doped region 40 each includes the same type of dopant. For instance, the first doped zone and the second doped zone in an n-type doped region 40 each includes an n-type dopant. The first doped zone and the second doped zone included in the same doped region can have the same dopant concentration or different concentrations. Additionally, the first doped zone can contact the second doped zone so as to form the doped region 40 or can overlap with the second doped zone 48 so as to form the doped region 40. In some instances, the first doped zone and the second doped zone overlap and at least a portion of the overlap is located in slab region of the active medium 27.

Although FIG. 4 shows the doped region 40 not extending down to the optical insulator 28, the doped region 40 can extend down to the optical insulator 28 or into the optical insulator 28.

The optical device of FIG. 4 can be constructed using fabrication technologies that are employed in the fabrication of integrated circuits, optoelectronic circuits, and/or optical devices. FIG. 5A through FIG. 5E illustrate a method of forming the active component of FIG. 4. The method is illustrated using a silicon-on-insulator wafer or chip as the starting precursor for the optical device. However, the method can be adapted to platforms other than the silicon-on-insulator platform.

Figure 5A:
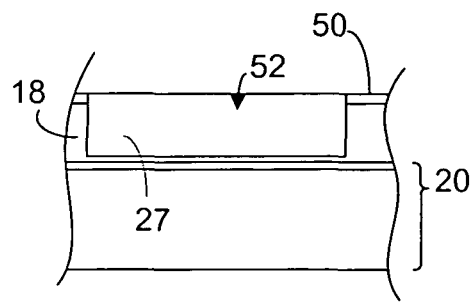
FIG. 5A through FIG. 5E illustrate a method of forming the active component of FIG. 4.

FIG. 5A illustrate a first mask 50 formed on a silicon-on-insulator wafer or chip to provide a device precursor. FIG. 5A is a cross-section of the device precursor. The first mask 50 leaves exposed a region of the device precursor where an active cavity 52 is to be formed while the remainder of the illustrated portion of the device precursor is protected. The active cavity 52 is the region of the device precursor where the electro-absorption medium will to be formed. A first etch is then performed so as to form the active cavity 52. The first etch is performed for a duration that allows the active medium 27 to remain at the bottom of the active cavity 52. A suitable first mask 50 includes, but is not limited to, a hard mask such as a silica mask. A suitable first etch includes, but is not limited to, a dry etch.

The active medium 27 is formed in the active cavity 52 so as to provide the device precursor of FIG. 3A. When the light-transmitting medium 18 is silicon and the active medium 27 is germanium or germanium-silicon, the active absorption medium 27 can be grown on the seed portion 34 of the light-transmitting medium.

After formation of the active medium 27, the first mask 50 can be removed and the device precursor can be planarized. Suitable methods for polishing include, but are not limited to, a chemical-mechanical polishing (CMP) process.

Figure 5B:
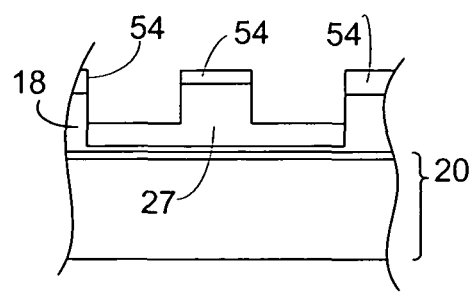

A second mask 54 can be formed on the device precursor as shown on the device precursor of FIG. 5B. The second mask 54 is formed such that the region where the ridge of the active medium 27 is to be formed is protected while the remainder of the active medium 27 remains exposed. A suitable second mask 54 includes a hard mask such as a silica mask. A second etch is performed so as to provide the device precursor of FIG. 5B. A suitable second etch includes, but is not limited to, a dry etch.

Figure 5C:
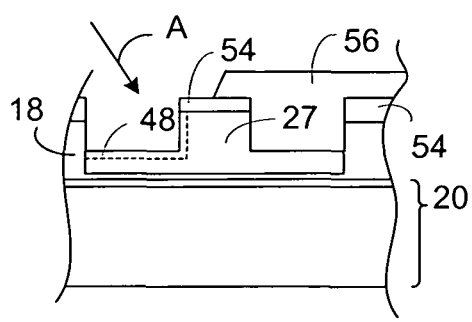

A third mask can be formed so as to protect the active medium 27 in one of the slab regions while leaving the other slab region exposed as shown in FIG. 5C. A suitable third mask 56 includes photoresist, silica, and silicon nitride. One of the second doped zones 48 is formed in the active medium 27 included in the ridge of the active medium and also in the slab region of the active medium 27. Suitable methods of forming the second doped zone 48 include, but are not limited to, dopant implantation. As illustrated by the arrow labeled A in FIG. 3E, the direction of the dopant implantation during the formation of the second doped zones 48 can be angled such that the doping for the second doped zone 48 occurs both in the ridge of active medium 27 and in the slab region of the active medium 27.

Figure 5D:
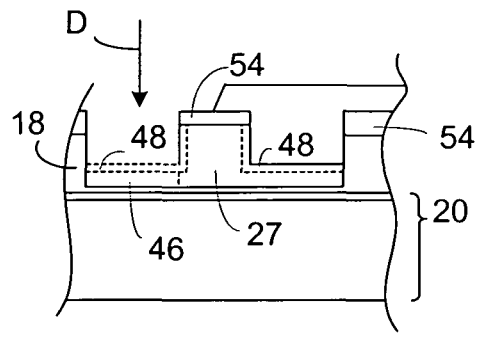
Figure 5E:
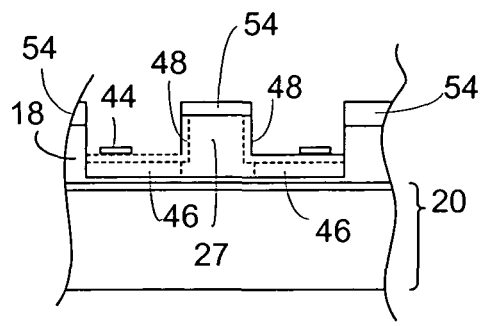

The first doped zone 46 is formed so as to provide the device precursor of FIG. 5D. Suitable methods of forming the first doped zones 46 include, but are not limited to, dopant implantation. As illustrated by the arrow labeled B in FIG. 5D, the direction of the dopant implantation during the formation of the first doped zones 46 can be substantially perpendicular to the surface of the light-transmitting medium at the bottom of the active cavity 52. As a result, first doped zone is located in the slab region of the active medium 27 without being substantially present in the ridge of the active medium 27. Accordingly, the formation of the first doped zone 46 does not substantially affect the portion of the second doped zone 48 in the ridge of the active medium 27. FIG. 5D shows the first doped zone being formed after the second doped zone. In this case, the first doped zone can be formed under the second doped zone such that the first doped zone is adjacent to the second doped zone and/or contacts the second doped zone. The doped zone can be formed under the first zone by increasing the energy used during dopant implantation. As an alternative to forming the first doped zone under the second doped zone, the first doped zone can be formed so it overlaps the second doped zone. For instance, the first doped zone can extend up to the upper surface of the slab region. In these instances, the portion of the resulting doped region having the first doped zone overlapping the second doped zone can show an increased dopant concentration.

The third mask 56 can be removed and the series of steps associated with FIG. 5C and FIG. 5D repeated for the opposite side of the ridge. For instance, a first doped zone and a second doped zone can be formed on the opposite side of the ridge while the first doped zone and the second doped zone that were already formed are protected by a fourth mask (not shown). The electrical conductors 44 are added to provide the active component of FIG. 5E and FIG. 4. A comparison of FIG. 5E with FIG. 4 shows that a first doped zone 46 and a second doped zone 48 from FIG. 5E combine to serves as each of the doped regions 40 of FIG. 4.

The steps illustrated in FIG. 5A through FIG. 5E need not be performed in the illustrated sequence. For instance, the first doped zone 46 for a doped region 40 can be formed before the second doped zone 48 of that doped region 40.

Figure 6A:
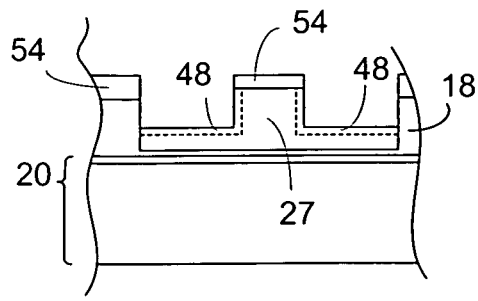
FIG. 6A through FIG. 6D illustrate another method of forming the active component of FIG. 4.
Figure 6B:
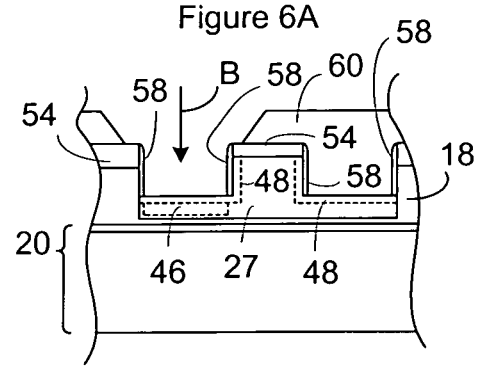

The method of FIG. 5A through FIG. 5E can also mask the sidewalls of the active cavity 52 during the formation of the first doped zones 46. For instance, the n-type and p-type second doped zones 48 can be serially formed on the device precursor of FIG. 5B so as to provide the device precursor of FIG. 6A. A fifth mask 58 can then be formed on the sidewalls of the active cavity 52 as shown in FIG. 6B. Suitable materials for the fifth mask 58 include, but are not limited to, TEOS (tetraethylorthosilicate) as a silicon source, and silicon nitride. The fifth mask 58 can be formed by depositing the fifth mask material on the device precursor of FIG. 5B and dry etching the fifth mask material using a patterned photoresist in order to transfer the pattern of the photoresist onto the fifth mask. Suitable methods for depositing the fifth mask include, but are not limited to, Chemical Vapor Deposition (CVD) and Plasma Enhanced Chemical Vapor Deposition (PECVD).

The photoresist is removed and a sixth mask 60 is formed on the device precursor as shown in Figure of FIG. 6B. The sixth mask 60 protects the slab region of the active medium 27 on one side of the ridge while leaving the slab region of the active medium 27 on the opposing side of the ridge exposed. The first doped zone 46 can then be formed in the exposed slab region of the active medium. Suitable methods of forming the first doped zones 46 include, but are not limited to, dopant implantation. As illustrated by the arrow labeled B in FIG. 6B, the direction of the dopant implantation during the formation of the first doped zones 46 can be substantially perpendicular to the surface of the light-transmitting medium at the bottom of the active cavity 52. However, because the fifth mask 58 protects the sides of the ridge during the formation of the first doped zone, an angled dopant implant can be performed to form the first doped zone 46.

FIG. 6B shows the first doped zone being formed after the second doped zone. In this case, the first doped zone can be formed under the second doped zone such that the first doped zone is adjacent to the second doped zone and/or contacts the second doped zone. The doped zone can be formed under the first zone by increasing the energy used during implantation of the dopant into the first doped zone. As an alternative to forming the first doped zone under the second doped zone, the first doped zone can be formed so it overlaps the second doped zone. For instance, the first doped zone can extend up to the upper surface of the slab region. In these instances, the portion of the resulting doped region having the first doped zone overlapping the second doped zone can show an increased dopant concentration.

Figure 6C:
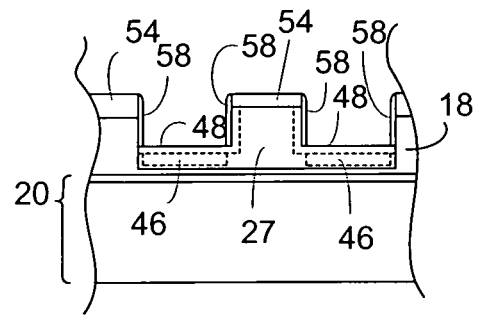

The sixth mask 60 can be removed and the series of steps associated with FIG. 6B repeated for the opposite side of the ridge in order to provide the device precursor of FIG. 6C. For instance, another first doped zone 46 can be formed on the opposite side of the ridge while the first doped zone 46 of FIG. 6B are protected by a seventh mask.

Figure 6D:
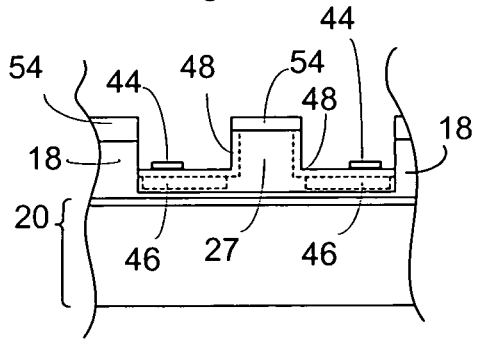

The fifth mask can be removed and the electrical conductors 44 added to provide the active component of FIG. 6D and FIG. 4. A comparison of FIG. 6D with FIG. 4 shows that a first doped zone 46 and a second doped zone 48 from FIG. 5E combine to serves as each of the doped regions 40 of FIG. 4. Although FIG. 6B through FIG. 6D illustrate one or more of the first doped zones 46 that do not extend down to the base 20, one or more of the first doped zones can extend down to the base or into the base 20.

As discussed in the context of FIG. 4, problems associated with increasing the thickness of the slab regions need not arise in an active component constructed according to FIG. 4 because they can be addressed by extending the doped regions 40 further into the slab region. As a result, the slab regions of the active medium 27 can be very thick. Accordingly, the etch that defines the ridge of the active medium (the second etch of FIG. 5B) can be an intentional under-etch relative to the active component of FIG. 1G. For instance, the duration of the second etch can be shorter than the etch that is associated with generating slab regions of active medium 27 with the thickness of FIG. 1G. By intentionally under-etching during the second etch, the problems with undesirably thin active medium 27 slab regions also do not arise. As a result, the method of FIG. 5A through FIG. 6D provides an active component that is not strongly dependent on the thickness of the slab regions. Without this dependence, the effects of inconstant etching results do not affect the device fabrication and there is less waste in the fabrication process.

As noted above, the first doped zone and the second doped zone that combine to form a single doped region 40 have the same type of dopant. In some instances, the first doped zone and the second doped zone are formed to have substantially the same concentration in order to provide a doped region 40 with a substantially uniform doping concentration. However, the dopant concentration at locations of overlap between the first doped zone and the second zone can increase. Additionally or alternately, there can be other variations in the concentration of the dopant at the interface between a first doped zone and a second zone. Further, as is evident from the above description of the methods, the sequential formation of doped zones can require alignment of masks that are formed sequentially during different doping processes. Because precise alignment of serially formed masks is difficult, the combination of multiple doped zones into a single doped region can be evident from inconsistencies at the perimeter of the doped region. Accordingly, a doped region formed from multiple doped zone can be physically distinguished from a doped region formed from a single doped zone.

The above method descriptions use numerical labels to label different masks. For instance, different masks are called first mask, second, etc. The numerical value does not indicate sequence and instead is used to note different masks. Accordingly, a third mask could be used before a first mask.

Although the active component is disclosed above as having at least two doped regions on opposing sides of a ridge where the doped regions have similar structures with the exception of dopant type, the doped regions on opposing sides of a ridge can have different structures. Accordingly, an active component can have only one active region as disclosed above. For instance, an active component can have a first doped region constructed as disclosed above and a second doped region located on the opposite side of the ridge and that uses a different structure and/or method of construction. Rather than being a second doped region, a more conventional electrical conductor such as a wire or metal trace can replace the second doped region. As a result, the active component can include a single doped region.

The doped regions can optionally extend to or past the input side of the light-transmitting medium as disclosed in U.S. Patent Application No. 61/572,841. Additionally or optionally, the active component can be constructed such that the electrical conductors 44 do not contact the doped regions in the active medium but instead contact the doped regions in the light-transmitting medium as disclosed in U.S. patent application Ser. No. 13/136,828.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical device, comprising:
an active component on a base and having at least one functionality selected from a group consisting of light sensor functionality and light modulator functionality; and
the active component configured to guide the light signal through a ridge of an active medium extending upwards from slab regions located on opposing sides of the ridge,
the ridge of active medium being positioned on a light-transmitting medium located between the ridge and the base,
a doped region extending into a lateral side of the ridge of the active medium and also extending into one of the slab regions such that at least a portion of the doped region is located in the light-transmitting medium.

2. The device of claim 1, wherein the slab region into which the doped region extends includes the active medium.

3. The device of claim 2, wherein the doped region extends into the active medium included in the slab region.

4. The device of claim 1, wherein the slab regions exclude the active medium.

5. The device of claim 1, wherein the doped region is located under the ridge such that a line that is perpendicular to the base can extend through the ridge and also through a portion of the light-transmitting medium that includes the doped region.

6. The device of claim 1, wherein the doped region extends through the light-transmitting medium and contacts the base.

7. The device of claim 1, wherein the doped region extends further into the slab region than into the ridge.

8. The device of claim 1, wherein multiple doped zones combine to form each one of the doped regions.

9. The device of claim 8, wherein one of the doped zones included in the doped region is a first doped zone and another one of the doped zones included in the doped region is a second doped zone,
the first doped zone being located in one of the slab regions but not in the ridge and the second doped zone being located in both the ridge and in one of the slab regions.

10. The device of claim 8, wherein one of the doped zones included in the doped region is a first doped zone and another one of the doped zones included in the doped region is a second doped zone,
the first doped zone being located in the light-transmitting medium but not in the active medium.

11. The device of claim 1, wherein the doped region is one a plurality of doped regions included on the active component and at least two of the doped regions are located in the slab regions on opposing sides of the ridge.

12. The device of claim 1, further comprising:
a waveguide on the base and configured to guide the light signal through the light-transmitting medium, the active component positioned such that the ridge of active medium receives the light signal from the waveguide.

13. A method of forming an optical device comprising:
generating a device precursor having a light-transmitting medium on a base,
forming a first doped zone in the light-transmitting medium,
forming a ridge in an active medium located on the light-transmitting medium,
the ridge being formed such that the ridge extends upwards from slab regions located on opposing sides of the ridge,
forming a second doped zone that combines with the first doped zone to form a continuous doped region for the active component, the doped region extending into both the ridge and into one of the slab regions.

14. The method of claim 13, wherein the ridge is formed over a portion of the first doped zone such that a line that is perpendicular to the base can extend both the ridge and the portion of the first doped region.

15. The method of claim 13, wherein the first doped zone does not extend into the active medium.

16. The method of claim 13, wherein the ridge is formed after the first doped zone is formed.

17. The method of claim 13, wherein the second doped zone is formed after the ridge is formed.

18. The method of claim 13, wherein the device precursor is annealed before the device precursor includes the active medium.

19. The method of claim 18, wherein the device precursor is annealed between forming the first doped regions and forming the ridge.

20. The method of claim 18, wherein the device precursor is annealed at a temperature above 700° C.

* * * * *